United States Patent [19]

Shinohara

[11] Patent Number: 5,502,334
[45] Date of Patent: Mar. 26, 1996

[54] METAL WIRING

[75] Inventor: Keiji Shinohara, Kanagawa, Japan

[73] Assignee: Sony Corporation, Toky0, Japan

[21] Appl. No.: 149,946

[22] Filed: Nov. 10, 1993

[30] Foreign Application Priority Data

Nov. 10, 1992 [JP] Japan ............... 4-326128

[51] Int. Cl.⁶ ............................... M01L 23/48
[52] U.S. Cl. ........................... 257/751; 257/753
[58] Field of Search .................. 257/751, 767, 257/753

[56] References Cited

U.S. PATENT DOCUMENTS

| | | | |
|---|---|---|---|
| 4,824,802 | 4/1989 | Brown et al. | 437/192 |
| 4,824,803 | 4/1989 | Us et al. | 257/767 |
| 4,933,743 | 6/1990 | Thomas et al. | 257/753 |
| 5,202,579 | 4/1993 | Fujii et al. | 257/751 |
| 5,278,448 | 1/1994 | Fujii | 257/750 |
| 5,305,519 | 4/1994 | Yamamoto et al. | 29/852 |

*Primary Examiner*—Rolf Hille
*Assistant Examiner*—Roy Potter
*Attorney, Agent, or Firm*—Hill, Steadman & Simpson

[57] ABSTRACT

A metal wiring is composed of an electroconductive adhesive layer formed on the inner wall of a contact hole provided in a dielectric film and on the surface of the above mentioned dielectric film, a first metal wiring arranged on the adhesive layer and filling the contact hole, and a second metal wiring which is made of a metal which is different from that of the first metal wiring and is formed on the above mentioned first metal wiring. The first metallic film formed on the above mentioned first metal wiring is formed by, for example, the blanket tungsten-CVD method.

16 Claims, 3 Drawing Sheets

METAL WIRING

FIELD OF THE INVENTION

The present invention is used in wiring for semiconductor devices and in methods for the production thereof, and relates particularly to metal wiring and a method of forming it.

DESCRIPTION OF THE PRIOR ART

With the miniaturization of design standards for semiconductor devices, contact holes have been introduced with smaller diameters. However, the film thickness of layer dielectric films used for maintaining dielectric strength has undergone almost no change. As a result, the aspect ratio of the contact holes has become larger. Therefore, when the wiring is formed with aluminum film alone, the coating of the aluminum film on the separated sections is not good, which leads to poor continuity at the contact holes and a consequent reduction in the reliability of the semi-conductor device.

Also, the so-called selective tungsten-CVD (chemical vapor development) method has been proposed as an alternative method for the formation of wiring in which, after the contact holes are formed, a reduction reaction of, for example, tungsten hexafluoride ($WF_6$) is used to form a tungsten (W) film only in the interior of the contact holes. The principle of this method is a problem, in that equal selective development of the tungsten in all of the contact holes is difficult, and contact holes of differing depths cannot be filled simultaneously.

The so-called blanket tungsten-CVD method has been proposed as a solution to the above mentioned problem. In this method, after the contact holes are formed, a tungsten film is formed both in the interior of the contact holes and on the dielectric film in which the contact holes are formed. Etching is then performed on the tungsten film, and the tungsten film is left only in the interior of the contact holes. In this method, formation of the film is easier than by the selective tungsten-CVD method explained above, and it is possible to simultaneously fill all of the contact holes of differing depths.

In the above mentioned blanket tungsten-CVD method, the contact holes may be filled with the tungsten film even after formation of the titanium oxide nitride (TiON) layer to improve the adherence onto the silicon oxide ($SiO_2$) film serving as the dielectric film. In this case, since the titanium oxide nitride layer functions as a barrier layer, even when the wire is formed at relatively high temperatures to conform to the high melting point of tungsten of 3380° C., the penetration of tungsten into, for example, the silicon substrate is inhibited, and favorable electrical properties may be obtained.

SUBJECT MATTER OF THE INVENTION

Nevertheless, the specific resistance value of an aluminum-silicon (Al—Si) film is about 2.9 $\mu\Omega$.cm, while the specific resistance value of a tungsten film is about 10 $\mu\Omega$.cm. Thus, since the specific resistance value of tungsten films is higher than that of Al—Si films, wiring cannot be formed with a tungsten film alone. If the wiring is formed with a tungsten film, the cross-sectional area of the wiring must be increased, and therefore a high integration of the element cannot be accomplished.

Therefore, when employing the blanket tungsten-CVD method or the selective CVD method, both of which allow the production of a film with good coverage, it is necessary to form the wiring with Al—Si of a low specific resistance value. In this case, a step of etchbacking the tungsten film formed in the contact holes to form a plug is required. At the same time, etchbacking is also preformed on a titanium film which is provided to maximize the adherence between the tungsten film and the dielectric film. However, if etchbacking is performed using chlorine gas, the etching speed is faster with a titanium film than with a tungsten film, and therefore the titanium film on the upper side walls of the contact holes is stripped off, causing cavities in those sections.

Also, since the tungsten film accumulates on the lower insides and the inner side walls of the contact holes, the accumulated tungsten film comes into contact with itself at the approximate centers of the contact holes, and that contacting section is in a weakened state. This section shall hereunder be referred to as the "seam section". Therefore, since the approximate centers of the plugs formed by the tungsten film are weakened, those areas are etched and cavities result.

When cavities result as described above, the coatability of the Al—Si film is reduced at the cavity sections. Particularly, if the diameter of the contact holes is half a micron or less, then the coatability is greatly reduced. As a result, the reliability of the wiring is vastly lowered.

The object of the present invention is to provide metal wiring with excellent coatability and a method of forming it.

DETAILED DESCRIPTION OF THE INVENTION

Figure 1:
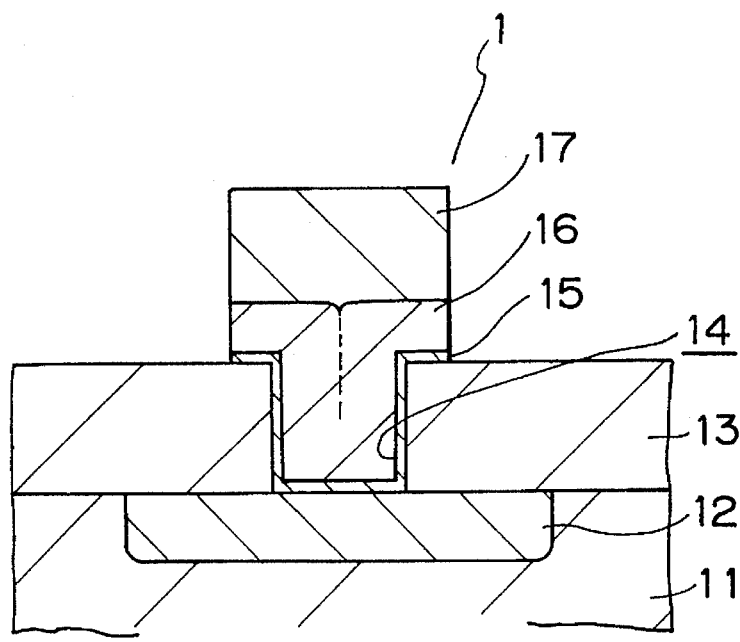
FIG. 1 is a rough sectional view of the structure of the first Example.

The present invention relates to metal wiring and a method of forming it, which are provided to achieve the above mentioned object.

That is, it relates to metal wiring which consists of an electroconductive adhesive layer formed on the inner wall of contact holes provided in a dielectric film and on the surface of the above mentioned dielectric film, a first metal wiring filled in the contact holes which is arranged on the adhesive layer, and a second metal wiring made of metal which is different from that of the first metal wiring and which is formed on the above mentioned first metal wiring.

Furthermore, relating to the above mentioned metal wirings, the above mentioned first metal wiring consists of a tungsten film which is formed by the blanket tungsten-CVD method. Alternatively, it consists of molybdenum, titanium, platinum, copper or a silicide compound thereof, or a metal containing aluminum.

Furthermore, the second metal wiring of the above mentioned metal wirings consists of aluminum or an aluminum alloy containing at least one of silicon, copper and titanium or has a laminated structure of an aluminum film or aluminum alloy film with a metallic film containing titanium, or it consists of copper or a copper alloy or has a laminated structure of a copper film or copper alloy film with a metallic film containing titanium.

Regarding the method of forming the metal wiring, in the first step, an electroconductive adhesive film is formed on the inner wall of the contact holes provided in the dielectric film and on the surface of the dielectric film, and in the second step, a first metallic film is formed on the adhesive film, filling the contact holes. Next, in the third step, a second metallic film made of a metal different from that of the first metallic film is formed on the first metallic film. In the following fourth step, the second metallic film, the first metallic film and the adhesive film are processed to form the second metal wiring, the first metal wiring, which contacts with the contact holes, is formed below the second metal wiring, and further an adhesive layer is formed, to form a metal wiring consisting of the above mentioned first metal wiring, second metal wiring and adhesive layer. Also, the first metallic film formed during the second step is formed using the blanket tungsten-CVD method.

In the metal wiring with the construction described above, the first metal wiring is formed on the adhesive layer, filling the contact holes provided in the dielectric film, while the second metal wiring is constructed above it, and thus there is no need for etchbacking of the first metal wiring. As a result, cavities do not occur in the adhesive layer above the contact holes. Furthermore, even if the first metal wiring consists of a tungsten film formed by the blanket tungsten-CVD method, the seam sections which occur in the tungsten film filling the contact holes are covered by the second metal wiring, and thus are not subjected to etching. As a result, the surface condition of the first metal wiring is favorably maintained, and thus there is no reduction in the coverage of the second metal wiring.

In the method of forming the metal wiring described above, after the first metallic film is formed on the adhesive layer film so as to fill the contact holes and the second metallic film is formed on the first metallic film, a metal wiring if formed with the first metallic film, the second metallic film and the adhesive layer film, and thus it is possible to form the first metallic film by the blanket tungsten-CVD method which provides good coverage. Also, since there is no need for etching of the first metallic film to form a plug in contact holes, the steps are simplified.

DESCRIPTION OF THE PREFERRED EMBODIMENTS

The first example according to the present invention will now be explained with reference to the rough sectional view of the structure in FIG. 1.

As shown in this diagram, a dispersion layer 12 is formed on the upper layer of a substrate (for example, a silicon substrate) 11. On this substrate 11 is formed a dielectric film (for example, a silicon dioxide film) 13, and a contact hole 14 is formed in the dielectric film 13 on the above mentioned dispersion layer 12. An electroconductive adhesive layer (for example, a titanium (Ti) layer) 15 is formed on the inner wall of this contact hole 14 and on the surface of the above mentioned dielectric film 13.

The adhesive wiring layer can be selected from the group consisting of Ti layers, TiN layers, TiON layers and TiW layers.

Also, a first metal wiring 16 is formed on the above mentioned adhesive layer 15 so as to fill the above mentioned contact hole 14. This first metal wiring 16 is formed of, for example, a blanket tungsten (W) film. Furthermore, on this first metal wiring 16 is formed a second metal wiring 17 made of a metal different from that of the first metal wiring 16. This second metal wiring 17 is formed of, for example, an aluminum-silicon film.

As described above, a metal wiring 1 is constructed through a contact hole 14 by the first and second metal wirings 15, 16 and the adhesive layer 15.

The above mentioned first metal wiring 16 may be formed of, for example, molybdenum, titanium, platinum, copper or a silicide compound thereof, or a metal containing aluminum.

Furthermore, the second metal wiring 17 may be formed of aluminum or an aluminum alloy containing at least one of silicon, copper and titanium. Alternately, it may be formed of copper or a copper alloy.

In the metal wiring 1 having the construction described above, the first metal wiring 16 is formed on the adhesive layer 15 so as to fill the contact hole 14 formed in the dielectric film 13, and the second metal wiring 17 is constructed above it, so that the upper surface of the first metal wiring 16 formed in the contact hole 14 is covered by the second metal wiring 17.

An explanation will now be given regarding the method of forming the metal wiring explained in the first example above, with reference to the construction flow chart in FIG. 2.

Figure 2:
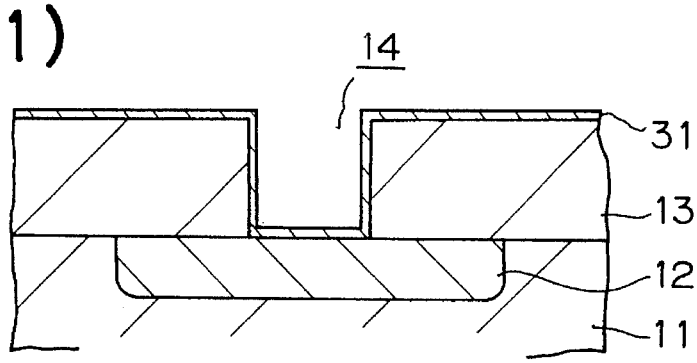
FIGS. 2(1) to 2(4) is a flowchart for the construction of the first Example.
Figure 2:
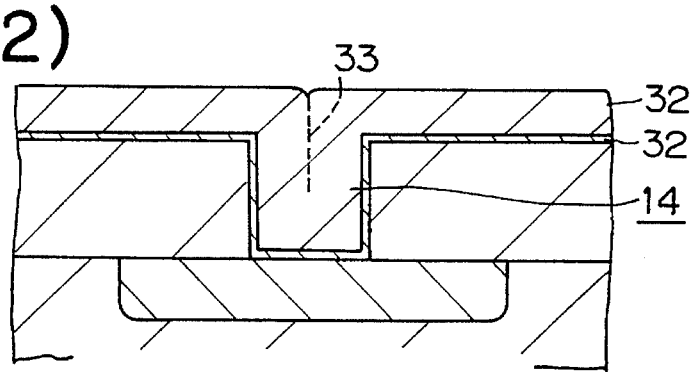
Figure 2:
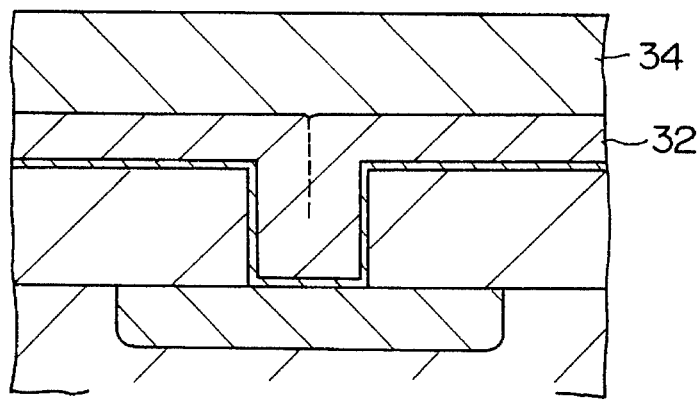
Figure 2:
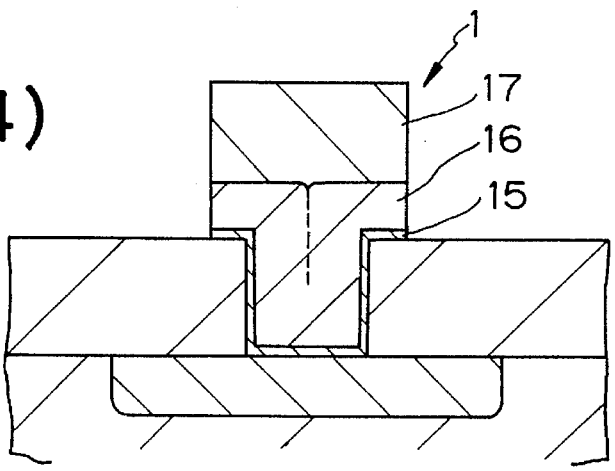

As shown in FIG. 2 (1), a dispersion layer 12 is formed on the upper layer of a substrate (for example, a silicon substrate) 11. In the first step, a film is formed by, for example the conventional CVD method, on a dielectric film 13 consisting of silicon dioxide on the upper surface of the substrate 11. Next, conventional photolithography techniques and etching are performed to form a contact hole 14 which penetrates the above mentioned dielectric film 13 on the above mentioned dispersion layer 12. Then, for example, the reactive spatter method is used to successively form, for example, a titanium (Ti) film and titanium oxide nitride (TiON) film as an electroconductive adhesive layer film 31 on the inner wall of the contact hole 14 and on the surface of the dielectric film 13. In place of the titanium oxide nitride (TiON) in the above mentioned adhesive layer film 31 may be used, for example, a titanium nitride (TiN) film.

Next, the second step shown in FIG. 2 (2) is carried out. In this step, a first metallic film 32 is formed on the upper surface of the above mentioned adhesive layer film 31 using, for example, the blanket tungsten-CVD method, so as to fill the above mentioned contact hole 14. Therefore, the first metallic film 32 is composed of a blanket tungsten film.

Regarding the conditions for forming the above mentioned film, as the reactive gas is used a mixed gas having a gas ratio of 19 parts tungsten hexafluoride ($WF_6$) to 1 part hydrogen, the substrate temperature is 400° C., and the ambient pressure for the reaction is set to 867 Pa. Also, the first metallic film 32 is formed to a thickness equal to about 50% of the diameter of the contact hole 14.

Since the first metallic film 32 accumulates on the lower side and on the inner side wall of the contact hole 14, the accumulated first metallic film comes into contact with itself at the approximate center of the contact hole 14, and thus that section is in a weakened state. This section shall hereunder be referred to as the "seam section" 33.

Next, the third step shown in FIG. 2 (3) is carried out. In this step, for example, a conventional spatter method is used to form a second metallic film 34 made of a metal different from that of the above mentioned first metallic film 32, on the upper surface of the first metallic film 32. This second metallic film 34 is formed by, for example, an aluminum-silicon film.

Then, the fourth step shown in FIG. 2 (4) is carried out. In this step, conventional photolithography techniques and etching are used to strip off the second metallic film 34, the first metallic film 32 and the adhesive layer film 31, to form the second metal wiring 17 with the second metallic film 32 and the first metal wiring 16 contacting with the contact hole 14 under the second metal wiring, with the first metallic film 32. Furthermore, the adhesive layer 15 is formed by the adhesive layer film 31 under the first metal wiring 16.

The above mentioned etching of, for example, the second metallic film (aluminum-silicon film) 34 is performed under the following conditions. That is, as the reactive gas is used a mixed gas containing borium trichloride ($BCl_3$) at a flow rate of 60 sccm and chlorine gas ($Cl_2$) at a flow rate of 90 sccm. Also, the etching conditions are, for example, an ambient pressure during etching of 1.1 Pa, a microwave current of 300 mA, and a substrate bias of 40 W.

With the above mentioned reactive gas, the first metallic film 32 made of blanket tungsten cannot be etched. Here, when the first metallic film (blanket tungsten film) 32 is exposed, switching is made to the etching gas described below.

That is, the reactive gas to be used is a mixed gas containing sulfur hexafluoride ($SF_6$) at a flow rate of 80 sccm and chlorine ($Cl_2$) at a flow rate of 40 sccm. Also, the etching conditions are, for example, an ambient pressure during etching of 1.1 Pa, a microwave current of 300 mA, and a substrate bias of 30 W.

Under the above mentioned conditions, the fluorine gas and tungsten react to produce a fluoride of tungsten. This tungsten fluoride has a high vapor pressure, and thus its etching is easily promoted. At the same time, chlorine radical and tungsten react resulting in tungsten chlorides with low vapor pressures, including tungsten pentachloride ($WCl_5$), tungsten hexachloride ($WCl_6$), etc. However, these reaction products produced on the etched sections are removed by the spattering effect, and thus do not interfere with the etching. Tungsten chlorides are also produced on the inner wall of the metal wiring 1 which is formed, and the spattered particles of the reaction products produced on the above mentioned etched sections readhere thereto. These chlorides have low vapor pressures, and thus there is practically no evaporation thereof, and they act as the so-called inner wall protective films (not shown). As a result, the side reaction by the fluorine radical is prevented, and the anisotropic processing of the first metallic film 32 is possible.

In addition, the adhesive layer film 31 also undergoes etching by the chlorine radical. At the same time, in order to raise the selective ratio with respect to the underlying dielectric film 13, the etching gas is switched to a mixed gas containing boron trichloride ($BCl_3$) at a flow rate of 60 sccm and chlorine ($Cl_2$) at a flow rate of 90 sccm, and the etching ambient pressure is set to 1.1 Pa, the microwave current to 300 mA, and the substrate bias to 40 W. By etching under these etching conditions, etching of the adhesive layer film 31 is possible with a high selective ratio with respect to the dielectric film 13.

Thus is completed the metal wiring 1 composed of the first metal wiring 16, the second metal wiring 17 and the adhesive layer 15.

In the method of forming the metal wiring 1 described above, etching to form the metal wiring 17 is performed with the seam section 33 of the first metallic film 32 formed in the contact hole 14 covered by the second metallic film 34, and thus there is no etching of the seam section 33 and no forming of concave pits. Therefore, the reliability of the wiring is increased.

In addition, by forming the first metallic film 32 filling the contact hole using the blanket tungsten-CVD method which allows good coverage, the coverage of the second metallic film 34 is also improved.

Figure 3:
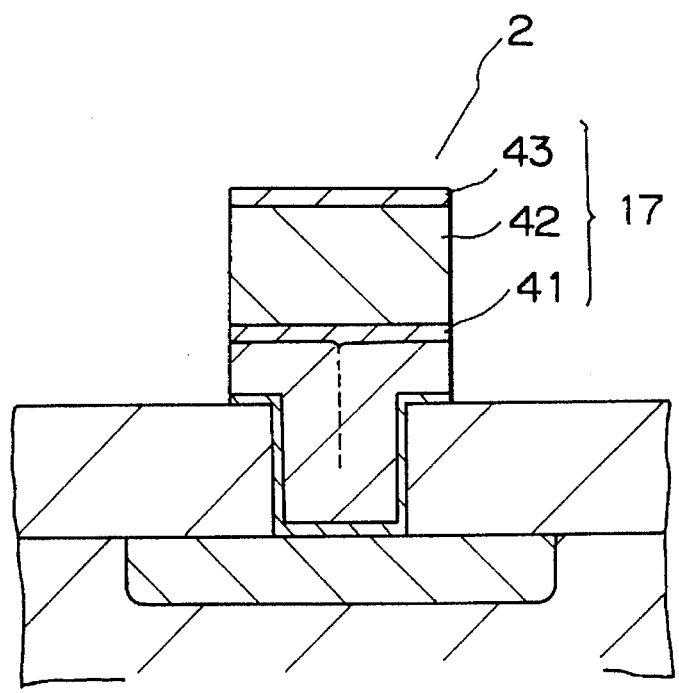
FIG. 3 is a rough sectional view of the structure of the first Example.

An explanation will now be given regarding a second example of a metal wiring, with reference to the rough sectional view of the structure in FIG. 3.

As shown in the diagram, the metal wiring 2 is similar to the metal wiring 1 explained in the first example described above, except that the second metal wiring 17 is formed by a laminated layer composed of, for example, a metallic film containing titanium (for example, a titanium film) 41, a main wiring film formed on the upper surface thereof (for example, an aluminum-silicon film) 42 and an additional metallic film containing titanium (for example, a titanium nitride oxide film) formed on the upper surface thereof.

Also, the above mentioned main wiring film 42 may be formed of, for example, an aluminum film, an aluminum alloy film other than the above mentioned aluminum-silicon film, a copper film, or copper alloy film, etc.

In the explanation of the second example, explanations of parts similar to those referred to in the explanation of the first example will be omitted.

In the metal wiring 2 having the construction described above, the first metal wiring 16 is formed on the adhesive layer 15 so as to fill the contact hole 14 formed in the dielectric film 13, and the second metal wiring 17 is constructed above it, so that the section of the first metal wiring 16 formed in the contact hole 14 is covered by the second metal wiring 17.

An explanation will now be given regarding the method of forming the metal wiring explained in the second example above, with reference to the construction flow chart in FIG. 4.

Figure 4:
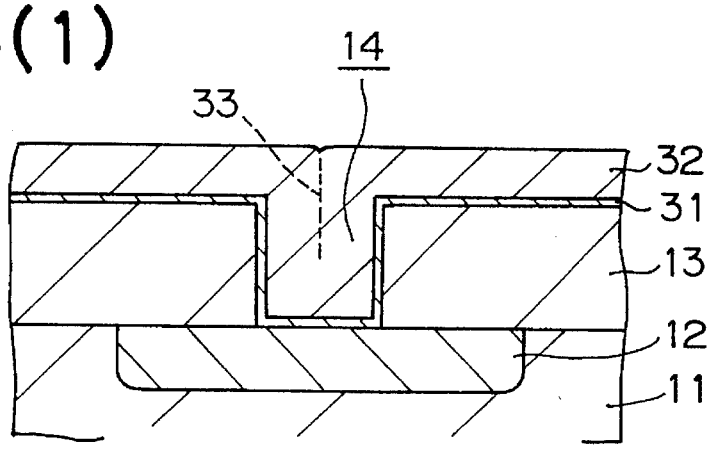
FIGS. 4(1) to 4(3) is a flow/chart for the construction of the second Example.
Figure 4:
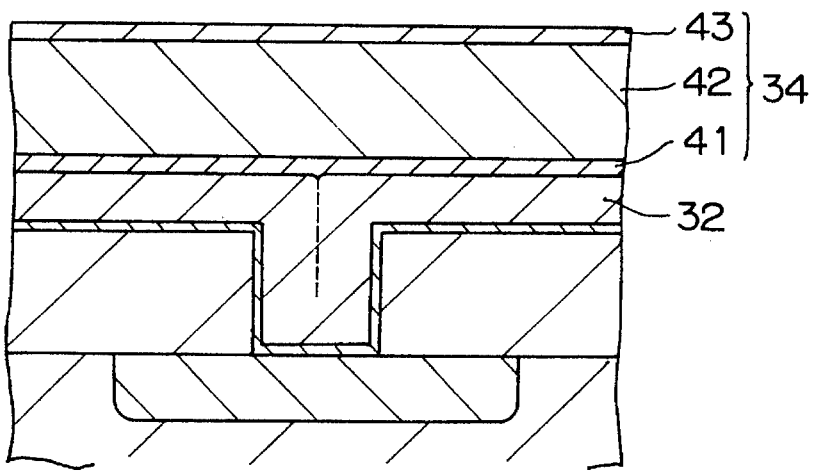
Figure 4:
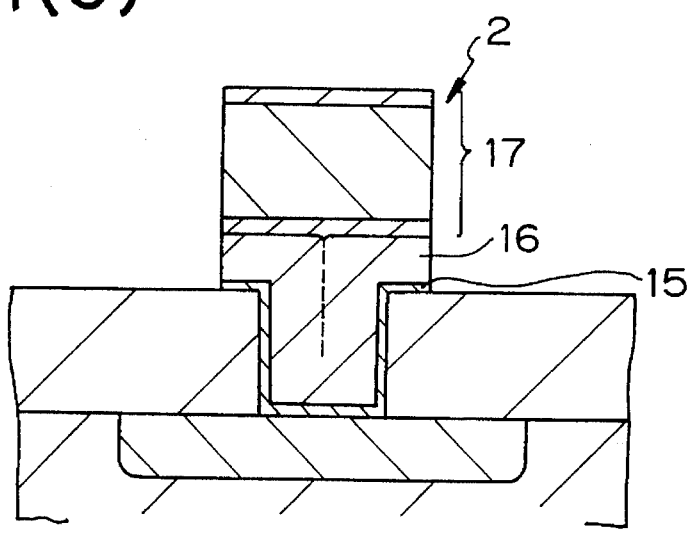

As shown in FIG. 4 (1), starting in the first step, a dielectric film 13 consisting of silicon dioxide is formed on the upper surface of a silicon substrate 11 in the same manner as explained above in the first example. Next, a contact hole 14 which penetrates through the dielectric film 13 on a dispersion layer 12 is formed. Then, for example, a titanium (Ti) film and titanium oxide nitride (TiON) film are successively formed as an electroconductive adhesive layer film 31 on the inside wall of the contact hole 14 and on the surface of the dielectric film 13. In place of the titanium oxide nitride (TiON) in the adhesive layer film 31 may be used, for example, a titanium nitride (TIN) film.

Next, the second step is carried out. In this step, a first metallic film 32 is formed on the upper surface of the above mentioned adhesive layer film 31 in the same manner as explained above with respect to the first example using, for example, the blanket tungsten-CVD method, so as to fill the above mentioned contact hole 14.

Next, the third step shown in FIG. 4 (2) is carried out. In this step, for example, a conventional film forming technique is used to successively laminate, for example, a metallic film containing titanium (for example, a titanium film) 41, a main wiring film (for example, an aluminum-silicon film) 42 and a metallic film containing titanium (for example, a titanium nitride oxide film), on the upper surface of the first metallic film 32. This laminated film becomes the second metallic film 34.

Then, the fourth step shown in FIG. 2 (3) is carried out. In this step, conventional photolithography techniques and etching are used to strip off the second metallic film 34, the first metallic film 32 and the adhesive layer film 31, to form the second metal wiring 17 with the second metallic film 32, while the first metal wiring 16 contacting with the contact hole 14 is formed with the first metallic film 32 under the second metal wiring, and the adhesive layer 15 is formed by the adhesive layer film 31.

The above mentioned etching of, for example, the second metallic film 34 is performed under the same conditions as explained regarding the first example. That is, as the reactive gas is used a mixed gas containing borium trichloride and chlorine gas. Also, the etching conditions are, for example, an ambient pressure during etching of 1.1 Pa, a microwave current of 300 mA, and a substrate bias of 40 W.

However, with the above mentioned reactive gas, the first metallic film 32 made of blanket tungsten cannot be etched. Here, when the first metallic film (blanket tungsten film) 32 is exposed, the etching conditions are switched as described below.

That is, the reactive gas to be used is a mixed gas containing sulfur hexafluoride ($SF_6$) at a flow rate of 80 sccm and hydrogen bromide (HBr) at a flow rate of 40 sccm. Also, the etching conditions are, for example, an ambient pressure during etching of 1.1 Pa, a microwave current of 300 mA, and a substrate bias of 30 W.

Under the above mentioned conditions, the fluorine gas and tungsten react to produce a fluoride of tungsten. This tungsten fluoride has a high vapor pressure, and thus its etching is easily promoted. At the same time, bromine radical and tungsten react resulting in tungsten bromides with low vapor pressures, including tungsten pentabromide ($WCl_5$) or tungsten hexabromide ($WCl_6$), etc. However, these reaction products produced on the bottom section between the metal wiring 41 which is formed are removed by the spattering effect, and thus do not interfere with the etching. Tungsten bromides are produced on the inner wall of the metal wiring 41 which is formed, and the spattered particles of the reaction products produced on the above mentioned bottom section readhere thereto. These bromides have low vapor pressures, and thus there is practically no evaporation thereof, and they act as the so-called inner wall protective films. As a result, the side reaction by the fluorine radical is prevented, and the anisotropic processing of the first metallic film 32 is possible.

In addition, the adhesive layer film 31 undergoes etching by the bromine radical, in the same manner as explained above regarding the first example.

Thus is completed the metal wiring 2 composed of the second metal wiring 17, the first metal wiring 16 and the adhesive layer 15.

In the method of forming the metal wiring described above, etching to form the metal wiring 2 is performed with the seam section 33 of the first metallic film 32 formed in the contact hole 14 covered by the second metallic film 34, and thus there is no etching of the seam section 33 and no forming of concave pits. Therefore, the reliability of the wiring is increased.

In addition, by forming the first metallic film 32 filling the contact hole by use of the blanket tungsten-CVD method which allows good coverage, the coverage of the second metallic film 34 is also improved.

As described above, according to the present invention, the first metal wiring is formed on the adhesive layer, filling the contact hole provided in the dielectric film, while the second metal wiring is constructed above it, and thus there is no need for etchbacking of the first metal wiring. As a result, cavities do not occur in the adhesive layer above the contact holes. Furthermore, even if the first metal wiring consists of a tungsten film formed by the blanket tungsten-CVD method, the seam sections which occur in the tungsten film filling the contact holes are covered by the second metal wiring, and thus are not subjected to etching. As a result, there is no reduction in the coverage of the second metal wiring, and the reliability of the wiring is improved.

In addition, with a metal wiring having the construction described above, even if the first metal wiring is formed of molybdenum, titanium, platinum, copper or a silicide compound thereof, or a metal containing aluminum, there is no reduction in the coverage of the second metal wiring. Furthermore, the second metal wiring may be formed of aluminum or an aluminum alloy containing at least one of silicon, copper and titanium, or it may have a laminated structure of an aluminum film or aluminum alloy film with a metallic film containing titanium, it may be formed of copper or a copper alloy, or it may have a laminated structure of a copper film or copper alloy film with a metallic film containing titanium.

What is claimed is:

1. A semiconductor device having a metal wiring, comprising: an adhesive wiring layer formed conformally on a dielectric film having a contact hole with an underlying substrate, and inside said contact hole; a first metal wiring layer formed on said adhesive wiring layer, at least filling said contact hole and extending above and over a top surface of said dielectric film; and a second metal wiring layer formed on said first metal wiring layer; wherein the second metal wiring layer is a laminated film of layers having a center layer selected from the group consisting of Al and Al alloy layers, and Ti layers on opposite sides thereof.

2. A semiconductor device having a metal wiring according to claim 1, wherein the adhesive wiring layer is selected from the group consisting of Ti layers, TiN layers, TiON layers and TiW layers.

3. A semiconductor device having a metal wiring according to claim 1, wherein the first metal wiring layer is formed by the blanket CVD method.

4. A semiconductor device having a metal wiring according to claim 1, wherein the thickness of the first metal wiring layer is 50% or more of the inside diameter of said contact hole.

5. A semiconductor device having a metal wiring, comprising:

an adhesive wiring layer formed conformally on a dielectric film having a contact hole with an underlying substrate, and inside said contact hole;

a first metal wiring layer formed on said adhesive wiring layer, at least filling said contact hole and extending above and over a top surface of said dielectric film; and a second metal wiring layer formed on said first metal wiring layer;

wherein the second metal wiring layer is a laminated film of layers having a center layer selected from the group consisting of Cu and Cu alloy layers, and Ti layers on opposite side thereof.

6. A semiconductor device having a metal wiring according to claim 5, wherein the adhesive wiring layer is selected from the group consisting of Ti layers, TiN layers, TiON layers and TiW layers.

7. A semiconductor device having a metal wiring according to claim 5, wherein the first metal wiring layer is formed by the blanket CVD method.

8. A semiconductor device having a metal wiring according to claim 5, wherein the thickness of the first metal wiring layer is 50% or more of the inside diameter of said contact hole.

9. A semiconductor device as claimed in claim 1, wherein said first metal wiring layer is a blanket chemical vapor deposited tungsten layer.

10. A semiconductor device as claimed in claim 9, wherein said adhesive wiring layer is selected from the group consisting of Ti layers, TiN layers, TiON layers, and TiW layers.

11. A semiconductor device as claimed in claim 10, wherein said first metal wiring layer has a thickness of 50% or more of an inside diameter of the contact hole.

12. A semiconductor device as claimed in claim 9, wherein said first metal wiring layer has a thickness of 50% or more of an inside diameter of the contact hole.

13. A semiconductor device as claimed in claim 5, wherein said first metal wiring layer is a blanket chemical vapor deposited tungsten layer.

14. A semiconductor device as claimed in claim 13, wherein said adhesive wiring layer is selected from the group consisting of Ti layers, TiN layers, TiON layers, and TiW layers.

15. A semiconductor device as claimed in claim 14, wherein said first metal wiring layer has a thickness of 50% or more of an inside diameter of the contact hole.

16. A semiconductor device as claimed in claim 13, wherein said first metal wiring layer has a thickness of 50% or more of an inside diameter of the contact hole.

* * * * *